(12) United States Patent
Chan et al.

(10) Patent No.: US 6,882,058 B2
(45) Date of Patent: Apr. 19, 2005

(54) ORGANIC ACID CONTAINING COMPOSITIONS AND METHODS FOR USE THEREOF

(75) Inventors: Bruce C. B. Chan, Chino Hills, CA (US); Michael G. Todd, Anaheim Hills, CA (US)

(73) Assignee: Henkel Corporation, Rocky Hill, CT (US)

( * ) Notice: Subject to any disclaimer, the term of this patent is extended or adjusted under 35 U.S.C. 154(b) by 0 days.

(21) Appl. No.: 10/289,506

(22) Filed: Nov. 5, 2002

(65) Prior Publication Data

US 2004/0086719 A1 May 6, 2004

(51) Int. Cl.$^7$ .............................................. H01L 23/28
(52) U.S. Cl. ...................... 257/787; 257/788; 438/118; 438/6; 525/533; 524/322
(58) Field of Search ........................ 525/533; 524/322; 438/118, 106; 257/787, 788, 778, 793, 795; 428/413, 901; 523/455; 528/113; 29/855, 849

(56) References Cited

U.S. PATENT DOCUMENTS

| | | | |
|---|---|---|---|
| 3,721,647 A | * | 3/1973 | Mazzeo et al. .............. 524/287 |
| 4,714,730 A | * | 12/1987 | Briggs et al. ................ 524/321 |
| 5,064,481 A | | 11/1991 | Davis et al. |
| 5,203,076 A | | 4/1993 | Banerji et al. |
| 5,311,059 A | | 5/1994 | Banerji et al. |
| 5,358,992 A | | 10/1994 | Dershem et al. |
| 5,447,988 A | | 9/1995 | Dershem et al. |
| 5,489,641 A | | 2/1996 | Dershem |
| 5,646,241 A | | 7/1997 | Dershem et al. |
| 5,654,081 A | | 8/1997 | Todd |
| 5,717,034 A | * | 2/1998 | Dershem et al. ............. 525/276 |
| 5,718,941 A | | 2/1998 | Dershem et al. |
| 5,753,748 A | | 5/1998 | Dershem et al. |
| 5,872,168 A | * | 2/1999 | Katoot ....................... 524/354 |
| 6,211,320 B1 | | 4/2001 | Dershem et al. |
| 6,265,776 B1 | | 7/2001 | Gilleo |
| 6,319,969 B1 | * | 11/2001 | Walther et al. .............. 524/300 |
| 2003/0162911 A1 | * | 8/2003 | Xiao et al. ................... 525/533 |

FOREIGN PATENT DOCUMENTS

| | | | | |
|---|---|---|---|---|
| EP | 0 370 531 | | 11/1989 | ........... C08L/71/02 |
| EP | 0 484 157 A2 | | 10/1991 | ........... C08L/79/08 |
| EP | 0 469 785 A2 | | 2/1992 | ........... C08L/61/10 |
| EP | 0 503 866 A1 | | 3/1992 | ............ C09D/5/03 |
| EP | 0 811 619 A1 | | 12/1997 | ......... C07D/311/60 |
| WO | WO 93/15158 | | 8/1993 | ......... C09D/167/00 |
| WO | WO 00/40648 | | 7/2000 | ............ C08K/9/00 |
| WO | WO 02/04541 A2 | | 1/2002 | |
| WO | WO 02/086003 A1 | | 10/2003 | .............. C09J/7/00 |

* cited by examiner

*Primary Examiner*—David J. Buttner
*Assistant Examiner*—Christopher Keehan
(74) *Attorney, Agent, or Firm*—Steven C. Bauman (57) ABSTRACT

In accordance with the present invention, it has been discovered that the addition of organic acids provides improved performance properties to curable compositions, e.g., improved flux compatibility, improved flow properties, improved voiding properties, and the like. Accordingly, there are provided curable compositions having improved performance properties, methods for the preparation thereof, and methods employing same. Also provided are novel articles prepared using invention compositions.

22 Claims, 5 Drawing Sheets

Initial

100 Hrs HAST

ORGANIC ACID CONTAINING COMPOSITIONS AND METHODS FOR USE THEREOF

FIELD OF THE INVENTION

The present invention relates to curable formulations, particularly useful as encapsulants, underfills and adhesives, as well as methods for making and using same, and articles produced employing same.

BACKGROUND OF THE INVENTION

Underfill formulations are widely used in the electronics industry to bond various components, such as flip chips, to substrates. Typically, an underfill formulation is handled and applied at room temperature, or heated to an appropriate working temperature, where the formulation flows under the chip by capillary action. It is desirable therefore that underfill materials have good flow properties prior to curing, as well as good performance properties during and after curing.

Another common use of resins in the electronics industry is as a liquid encapsulant (also referred to as "glob top"), wherein an aliquot of resin material is used to encase (or encapsulate) a component to protect it from certain stresses and from exposure to the environment. To meet the industry's ever-increasing demand for device reliability, materials for encapsulant applications must meet increasingly stringent performance requirements. Such requirements include excellent moisture resistance, ionic purity, low dielectric constant and good thermal properties. In the absence of these properties, especially in the presence of moisture and ionic impurities, corrosion (and ultimately failure of the device) will likely occur at some point during the life of the device.

Underfill and encapsulant formulations are generally quite similar in composition, differing primarily in their end use. Whereas underfill formulations are employed to protect the solder bumps under a chip (and to provide a material of intermediate coefficient of thermal expansion between the chip and the substrate, thereby reducing stress), encapsulant formulations are employed to protect exposed components (e.g., wire bonds and components on the top of a chip), which components would otherwise be exposed to environmental factors such as heat, moisture, particulate matter, and the like.

In any event, both underfill formulations and encapsulant formulations oftentimes suffer from reduced reactivity in the presence of flux or flux residues. "Flux" refers to agents which promote the fusion of metals, and thus are commonly encountered in processes where electronic components are being fabricated. Flux residues refer to derivatives, decomposition products, and the like, of fluxing agents, as a result of such processes as hydrolysis, thermolysis, and the like. Flux or flux residues are undesirable because they are capable of chemically reacting with underfill formulations, potentially changing the characteristics thereof, e.g., reducing the adhesion properties, degrading the mechanical, thermal and/or chemical resistance thereof, and the like. Flux or flux residues can also cause poor flow properties, making handling such as dispensing of the formulation, difficult. In addition, flux or flux residues can lead to a propensity of such formulations to form voids upon cure, which may produce weakness in the resulting bond and/or a gap in the protection afforded by encapsulation.

Accordingly, there remains a need for formulations which display improved performance properties, such as good flux compatibility, improved flow properties, improved voiding characteristics, and the like.

SUMMARY OF THE INVENTION

In accordance with the present invention, it has been discovered that the addition of organic acids, such as phenolic materials, as defined herein, and/or carboxylic acids, as defined herein, provides improved performance properties to curable compositions, e.g., improved flux compatibility, improved flow properties, improved voiding properties, and the like. Accordingly, there are provided novel compositions having improved performance properties, methods for the preparation thereof, and methods for employing same. Also provided are novel articles prepared using invention compositions.

BRIEF DESCRIPTION OF THE FIGURES

FIG. 1 collectively presents the results of Scanning Acoustic Microscopy (operated in the "C" mode, also referred to as CSAM) analysis of commercially available underfill formulations and invention formulations prepared as described in Example 1, both before and after being subjected to a pressure cooker test (PCT, i.e., 121° C., 100% humidity at 2 atmospheres). Thus.

DETAILED DESCRIPTION OF THE INVENTION

In accordance with the present invention, there are provided methods for improving one or more performance properties of a non-fluxing adhesive composition, where the cure onset temperature of the non-fluxing adhesive composition is less than 170° C. Such performance properties include improved flux compatibility, improved flow properties, improved voiding characteristics, and combinations thereof. Invention methods comprise adding an amount of at least one organic acid to the non-fluxing adhesive composition effective to improve the one or more performance properties of the non-fluxing adhesive composition.

As readily recognized by those of skill in the art, invention methods can be employed for improving the performance properties of non-fluxing adhesive compositions, such as, for example, encapsulants, underfills, and the like. As employed herein, "non-fluxing adhesive" refers to adhesive compositions that do not have fluxing properties. Stated another way, such compositions generally lack a latent curing agent. Invention non-fluxing adhesive compositions can be contrasted to fluxing adhesive compositions known in the art which contain a latent curing agent so as to delay cure of the adhesive until after melting of solder associated therewith. Only after the solder is melted does cure of the fluxing adhesive commence. In contrast, non-fluxing adhesive compositions typically have a reduced cure onset temperature, which is not generally compatible with the presence of flux and/or flux residues, absent the treatment contemplated by the present invention.

Especially preferred compositions contemplated for treatment according to the present invention are capillary flow underfills.

As readily recognized by those of skill in the art, a variety of non-fluxing adhesive compositions are suitable for use in the practice of the present invention, e.g., epoxy resins, maleimide resins, (meth)acrylate resins, polyamide resins, polyimide resins, cyanate ester resins, and the like, as well as mixtures of any two or more thereof.

As employed herein, "flux compatibility" refers to the robustness of a formulation to the presence of flux, flux residues and/or reaction products thereof, e.g., the ability to form a strong adhesive bond to a flux contaminated surface. As noted above, the presence of flux often causes reduced reactivity of the respective formulation, as well as poor flow properties (making handling of the formulation difficult), and increased propensity of such formulations to form voids upon cure (producing weakness in the resulting bond and/or a gap in the protection afforded by encapsulation). In contrast to known formulations, invention formulations are substantially resistant to the negative effects of flux, and consequently do not suffer from the usual deterioration of performance in the presence thereof.

As employed herein, "flux contaminated" refers to formulations and/or surfaces containing flux or flux residues. As noted above, "flux" refers to agents which promote the fusion of metals, and thus are commonly encountered in processes where electronic components are being fabricated. Flux residues refer to derivatives, decomposition products, and the like, of fluxing agents, as a result of such processes as hydrolysis, thermolysis, and the like. Flux or flux residues are undesirable because they are capable of chemically reacting with underfill formulations, potentially changing the characteristics thereof, e.g., reducing the adhesion properties, degrading the mechanical, thermal and/or chemical resistance thereof, and the like. Flux or flux residues can also cause poor flow properties, making handling such as dispensing of the formulation, difficult. In addition, flux or flux residues can lead to a propensity of such formulations to form voids upon cure, which may produce weakness in the resulting bond and/or a gap in the protection afforded by encapsulation.

As employed herein, "flow properties" of an adhesive formulation refer to the viscosity of a formulation and the ease with which such formulation will flow and wet a flux contaminated surface to provide adhesive bonding thereto. Thus, any reduction in viscosity and/or surface tension of an adhesive formulation to a flux contaminated surface will lead to improved flow properties.

As employed herein, "voiding characteristics" of an invention adhesive formulation refer to the uniformity of an adhesive layer or "glob top" prepared from an invention formulation. Thus, a formulation with excellent voiding properties will cure to produce a substantially uniform, void-free layer, with minimal off-gassing or other disruption of the adhesive layer. As readily recognized by those of skill in the art, a variety of methods can be employed to determine the occurrence of voiding upon cure. For example, the cured surface can be visually inspected for evidence of void formation.

As readily recognized by those of skill in the art, "adding" at least one organic acid according to the invention can be accomplished in a variety of ways, such as, for example, by blending, mixing, tumbling, extruding, and the like.

Those of skill in the art can readily determine an effective amount of the at least one organic acid for addition according to the invention. An effective amount is that amount which is effective to improve one or more of the following performance properties: flux compatibility, flow properties and/or voiding characteristics. Those of skill in the art can readily determine suitable amounts of invention additives to accomplish the desired improvements, particularly after reviewing the examples set forth below.

Exemplary epoxy-based formulations contemplated for use in the practice of the present invention include resins prepared from $C_4$–$C_{28}$ alkyl mono- and di-glycidyl ethers (e.g., butyl glycidyl ether, 2-ethylhexyl glycidyl ether, butanediol diglycidyl ether, neopentyl glycol diglycidyl ether, and the like); $C_2$–$C_{28}$ alkyl- and alkenyl-glycidyl esters; $C_1$–$C_{28}$ alkyl-, mono- and poly-phenol glycidyl ethers (e.g., phenyl glycidyl ether, cresyl glycidyl ether, bisphenol A diglycidyl ether, bisphenol F diglycidyl ether, diglycidyl ortho-phthalate, diglycidyl para-phthalate, hydrogenated diglycidyl ortho-phthalate, and the like), epoxidized novolac resins, 3,4-epoxycyclohexylmethyl-3,4-epoxycyclohexane carboxylate, aniline diglycidyl ether, and the like. Presently preferred epoxy-based formulation contemplated for use in the practice of the present invention include formulations wherein the epoxy component is 1,6-glycidoxypropyl naphthalene, bis-(4-glycidoxyphenol) isopropane, bis-(4-glycidoxyphenol)methane, and the like. An especially preferred epoxy contemplated for use in the practice of the present invention is 1,6-glycidoxypropyl naphthalene.

Epoxy-based formulations can be cured employing a variety of promoters. A presently preferred promoter for such purpose is an anhydride. Exemplary anhydrides contemplated for such purpose include methylhexahydrophthalic anhydride (MHHA), hexahydrophthalic anhydride (HHPA), tetrahydrophthalic anhydride (THPA), nadic methyl anhydride, benzophenone-tetracarboxylicdianhydride (BTDA), anhydride-terminated polybutadiene, and the like.

As readily recognized by those of skill in the art, epoxy-based formulations are also capable of homopolymerization. Homopolymerizable systems contemplated for use in the practice of the present invention include formulations wherein a homopolymer of the reactive monomer is formed by free radical or cationic polymerization of an epoxy resin, e.g., polymerization of bisphenol F epoxy resin with 1-benzyl-2-methylimidazole (1-B-2-MZ). As readily recognized by those of skill in the art, such systems can be cured employing any of a variety of catalyst systems, such as, for example, substituted imidazoles, tertiary amines, cationic catalysts, and the like.

Exemplary maleimide resins contemplated for use in the practice of the present invention include resins prepared from compounds comprising the structure:

wherein:

m is an integer between 1 and 6, each R is independently selected from hydrogen or lower alkyl, and —X— is a branched chain alkyl, alkylene or alkylene oxide species having sufficient length and branching to render the maleimide compound a liquid.

As readily recognized by those of skill in the art, X can be any of a variety of moieties, such as, for example, a monovalent or polyvalent radical selected from:

branched hydrocarbyl or substituted branched hydrocarbyl species having in the range of about 12 up to about 500 carbon atoms, heteroatom-containing branched hydrocarbyl or substituted heteroatom-containing branched hydrocarbyl species having in the range of about 8 up to about 500 carbon atoms, hydrocarbylene or substituted hydrocarbylene species having in the range of about 12 up to about 500 carbon atoms, heteroatom-containing hydrocarbylene or substituted heteroatom-containing hydrocarbylene species having in the range of about 8 up to 500 carbon atoms, polysiloxane, and the like.

Exemplary (meth)acrylate resins contemplated for use in the practice of the present invention may be prepared from a host of different compounds. As used herein, the terms (meth)acrylic and (meth)acrylate are used synonymously with regard to the monomer and monomer-containing component. The terms (meth)acrylic and (meth)acrylate include acrylic, methacrylic, acrylate and methacrylate. The (meth)acrylates may comprise one or more members selected from a monomer represented by 1) the formula:

wherein:

G is hydrogen, halogen, or an alkyl having from 1 to 4 carbon atoms, $R^1$ has from 1 to 16 carbon atoms and is an alkyl, cycloalkyl, alkenyl, cycloalkenyl, alkaryl, aralkyl, or aryl group, optionally substituted or interrupted with silane, silicon, oxygen, halogen, carbonyl, hydroxyl, ester, carboxylic acid, urea, urethane, carbamate, amine, amide, sulfur, sulfonate, or sulfone;

2) urethane acrylates or ureide acrylates represented by the formula:

wherein:

G is hydrogen, halogen, or an alkyl having from 1 to 4 carbon atoms;

$R^8$ denotes a divalent aliphatic, cycloaliphatic, aromatic, or araliphatic group, bound through a carbon atom or carbon atoms thereof indicated at the —O— atom and —X— atom or group;

X is —O—, —NH—, or —N(alkyl)-, in which the alkyl radical has from 1 to 8 carbon atoms;

z is 2 to 6; and $R^9$ is a z-valent cycloaliphatic, aromatic, or araliphatic group bound through a carbon atom or carbon atoms thereof to the one or more NH groups; or 3) a di- or tri-(meth)acrylate selected from polyethylene glycol di(meth)acrylates, bisphenol-A di(meth)acrylates, tetrahydrofurane di(meth)acrylates, hexanediol di(meth)acrylate, trimethylol propane tri(meth)acrylate, and the like, as well as combinations of any two or more thereof.

Suitable polymerizable (meth)acrylate monomers include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerythritol triacrylate, bisphenol-A-ethoxylate dimethacrylate, trimethylolpropane ethoxylate triacrylate, trimethylolpropane propoxylate triacrylate, bisphenol-A-diepoxide dimethacrylate, and the like, as well as combinations of any two or more thereof.

Additionally, (meth)acrylate monomers contemplated for use herein include polyethylene glycol di(meth)acrylates, bisphenol-A di(meth)acrylates, tetrahydrofurane (meth) acrylates and di(meth)acrylates, citronellyl acrylate and citronellyl methacrylate, hydroxypropyl (meth)acrylate, hexanediol di(meth)acrylate, trimethylol propane tri(meth) acrylate, tetrahydrodicyclopentadienyl (meth)acrylate, ethoxylated trimethylol propane triacrylate, triethylene glycol acrylate, triethylene glycol methacrylate, and the like, as well as combinations of any two or more thereof.

Of course, (meth)acrylated silicones may also be used, provided the silicone backbone is not so large so as to minimize the effect of (meth)acrylate when cure occurs.

Other acrylates suitable for use herein include the low visvcosity acrylates disclosed and claimed in U.S. Pat. No. 6,211,320 (Dershem), the disclosure of which is expressly incorporated herein by reference in its entirety.

Exemplary polyamide resins contemplated for use in the practice of the present invention include polymeric materials with a plurality of amide (—C(O)—NR—) linkages.

Exemplary polyimide resins contemplated for use in the practice of the present invention include polymeric materials with a plurality of imide (—C(O)—NR—C(O)—) linkages.

Exemplary cyanate ester resins contemplated for use in the practice of the present invention include resins prepared from compounds such as those described in U.S. Pat. Nos. 5,358,992, 5,447,988, 5,489,641, 5,646,241, 5,718,941 and 5,753,748, each of which are hereby incorporated by reference herein in their entirety. For instance, cyanate esters useful as a component in the inventive compositions may be chosen from dicyanatobenzenes, tricyanatobenzenes, dicyanatonaphthalenes, tricyanatonaphthalenes, dicyanato-biphenyl, bis(cyanatophenyl)methanes and alkyl derivatives thereof, bis(dihalocyanatophenyl)propanes, bis(cyanatophenyl)ethers, bis(cyanatophenyl)sulfides, bis(cyanatophenyl)propanes, tris(cyanatophenyl)phosphites, tris(cyanatophenyl)phosphates, bis(halocyanatophenyl)methanes, cyanated novolac, bis[cyanatophenyl(methylethylidene)]benzene, cyanated bisphenol-terminated thermoplastic oligomers, and the like, as well as combinations of any two or more thereof.

More specifically contemplated for use herein are aryl compounds having at least one cyanate ester group on each molecule; such compounds may generally be represented by the formula Ar(OCN)m, where Ar is an aromatic radical and m is an integer from 2 to 5. The aromatic radical Ar should contain at least 6 carbon atoms, and may be derived, for example, from aromatic hydrocarbons, such as phenyl, biphenyl, naphthalene, anthracene, or the like. The aromatic radical Ar may also be derived from a polynuclear aromatic hydrocarbon in which at least two aromatic rings are attached to each other through a bridging group. Also included are aromatic radicals derived from novolac-type phenolic resins—i.e., cyanate esters of these phenolic resins. Ar may also contain further ring-attached, non-reactive substituents.

Examples of such cyanate esters include, for instance, 1,3-dicyanatobenzene; 1,4-dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanato-biphenyl; bis(4-cyanatophenyl)methane and 3,3', 5,5'-tetramethyl bis(4-cyanatophenyl)methane; 2,2-bis(3,5-dichloro-4-cyanatophenyl)propane; 2,2-bis(3,5-dibromo-4-dicyanatophenyl)propane; bis(4-cyanatophenyl)ether; bis(4-cyanatophenyl)sulfide; 2,2-bis(4-cyanatophenyl)propane; tris(4-cyanatophenyl)-phosphite; tris(4-cyanatophenyl)phosphate; bis(3-chloro-4-cyanatophenyl)methane; cyanated novolac; 1,3-bis[4-cyanatophenyl-1-(methylethylidene)]benzene, cyanated bisphenol-terminated polycarbonate or other thermoplastic oligomer, and the like, as well as combinations of any two or more thereof.

Particularly desirable cyanate esters contemplated for use herein are available commercially from Ciba Specialty Chemicals, Tarrytown, N.Y. under the tradename "AROCY" [1,1-di(4-cyanatophenylethane)]. The structures of three "AROCY" cyanate esters are shown below:

"AROCY" B-10

"AROCY" M-30

"AROCY" L-10

Organic acids contemplated for use in the practice of the present invention include phenolics, carboxylic acids, and mixtures thereof.

Phenolic compounds contemplated for use in the practice of the present invention are compounds having the structure:

$$X\text{--}(Phen)_m$$

wherein:
X is H, alkyl or a di- or poly-valent linker,
Phen is an optionally substituted phenol, and
m is 1–10, preferably 1–3.

When X is a di- or poly-valent linker, X can be an optionally substituted alkylene, optionally substituted oxyalkylene, optionally substituted carboxyalkylene, optionally substituted arylene, optionally substituted oxyarylene, optionally substituted polyalkyl sulfide, optionally substituted polyalkyl amide, or the like.

As used herein, "alkylene" refers to divalent hydrocarbyl radicals having 1 up to about 20 carbon atoms, preferably 2–10 carbon atoms; and "substituted alkylene" comprises alkylene groups further bearing one or more substituents selected from hydroxy, alkoxy, mercapto, cycloalkyl, substituted cycloalkyl, heterocyclic, substituted heterocyclic, aryl, substituted aryl, heteroaryl, substituted heteroaryl, aryloxy, substituted aryloxy, halogen, cyano, nitro, amino, amido, C(O)H, acyl, oxyacyl, carboxyl, carbamate, sulfonyl, sulfonamide, sulfuryl, and the like.

As used herein, "oxyalkylene" refers to the moiety —O-alkylene-, wherein alkylene is as defined above, and "substituted oxyalkylene" refers to oxyalkylene groups further bearing one or more substituents as set forth above.

As used herein, "carboxyalkylene" refers to the moiety —O—C(O)-alkylene or —C(O)—O-alkylene, wherein alkylene is as defined above, and "substituted carboxyalkylene" refers to carboxyalkylene groups further bearing one or more substituents as set forth above.

As used herein, "arylene" refers to divalent aromatic groups having in the range of 6 up to about 14 carbon atoms and "substituted arylene" refers to arylene groups further bearing one or more substituents as set forth above.

As used herein, "oxyarylene" refers to the moiety —O-arylene-, wherein arylene is as defined above, and "substituted oxyarylene" refers to oxyarylene groups further bearing one or more substituents as set forth above.

As used herein, "carboxyarylene" refers to the moiety —O—C(O)-arylene or —C(O)—O-arylene, wherein arylene is as defined above, and "substituted carboxyarylene" refers to carboxyarylene groups further bearing one or more substituents as set forth above. An exemplary carboxyarylene contemplated herein is a compound having the structure:

X=—OH, —NH$_2$, etc.

As used herein, "polyalkyl sulfide" refers to linkers having the structure:

$$-[(CR_2)_a-S]_b-$$

wherein:
a is 1–6;
b is at least 2 (and can be 400–500 or greater); and
each R is hydrogen, and
"substituted polyalkyl sulfide" refers to polyalkyl sulfides wherein one or more R groups are substituents other than hydrogen, as set forth above.

As used herein, "polyalkyl amide" refers to linkers having the structure:

wherein:
a is 1–6;
b is at least 2 (and can be 400–500 or greater);
each R is hydrogen; and
R' is hydrogen, and
"substituted polyalkyl amide" refers to polyalkyl amides wherein one or more R groups and/or R' are substituents other than hydrogen, as set forth above.

As readily recognized by those of skill in the art, the amount of phenolic compound employed in the practice of the present invention can vary widely, typically falling in the range of about 0.1 up to about 15 wt %, based on the weight of the total encapsulation formulation; preferably, the amount of phenolic compound falls in the range of about 0.2 up to about 5 wt %, based on the weight of the total encapsulation formulation; with in the range of about 0.5 up to about 2 wt % phenolic compound, based on the weight of the total encapsulation formulation being presently preferred.

Carboxylic acid compounds contemplated for use in the practice of the present invention are compounds having the structure:

wherein:
X' is H, alkyl or a di- or poly-valent linker, and
n is 1–10, preferably 1–3.

When X' is a di- or poly-valent linker, X' can be an optionally substituted alkylene, optionally substituted oxyalkylene, optionally substituted carboxyalkylene, optionally substituted arylene, optionally substituted oxyarylene, optionally substituted polyalkyl sulfide, optionally substituted polyalkyl amide, or the like.

As readily recognized by those of skill in the art, the amount of carboxylic acid compound employed in the practice of the present invention can vary widely, typically falling in the range of about 0.1 up to about 15 wt %, based on the weight of the total encapsulation formulation; preferably, the amount of carboxylic acid compound falls in the range of about 0.2 up to about 5 wt %, based on the weight of the total encapsulation formulation; with in the range of about 0.5 up to about 2 wt % carboxylic acid compound, based on the weight of the total encapsulation formulation being presently preferred.

In accordance with another embodiment of the present invention, there are provided methods for preparing non-fluxing adhesive compositions having one or more improved performance properties selected from the group consisting of flux compatibility, flow properties, voiding characteristics and combinations thereof, wherein the cure onset temperature of the non-fluxing adhesive composition is less than 170° C., the method comprising adding an effective amount of at least one organic acid to the non-fluxing adhesive composition.

In accordance with yet another embodiment of the present invention, there are provided curable compositions comprising:
a curable resin,
a curing agent,
optionally, a filler, and
at least one organic acid;
wherein the curable composition contains substantially no latent curing agent; and
wherein the cure onset temperature of the curable composition is less than 170° C.

In one aspect, curable compositions according to the invention have improved adhesion properties to flux contaminated surfaces, relative to compositions having no organic acid added thereto. As readily recognized by those of skill in the art, there are numerous methods available to determine adhesion properties of a formulation to facilitate the comparison contemplated above.

In another aspect, curable compositions according to the invention have improved flux compatibility, flow properties, voiding characteristics, and combinations thereof.

Optionally, invention compositions can further contain one or more of the following additional components: anti-oxidants, bleed control agents, one or more fillers, inert (i.e., nonreactive) diluents, reactive diluents, coupling agents, adhesion promoters, flexibilizers, dyes, pigments, and the like.

Anti-oxidants contemplated for use in the practice of the present invention include hindered phenols (e.g., BHT (butylated hydroxytoluene), BHA (butylated hydroxyanisole), TBHQ (tertiary-butyl hydroquinone), 2,2'-methylenebis(6-tertiarybutyl-p-cresol), and the like), hindered amines (e.g., diphenylamine, N,N'-bis(1,4-dimethylpentyl-p-phenylene diamine, N-(4-anilinophenyl) methacrylamide, 4,4'-bis($\alpha,\alpha$-dimethylbenzyl) diphenylamine, and the like), phosphites, and the like. When used, the quantity of anti-oxidant typically falls in the range of about 100 up to 2000 ppm, relative to the weight of the base formulation.

Bleed control agents contemplated for use in the practice of the present invention include cationic surfactants, tertiary amines, tertiary phosphines, amphoteric surfactants, polyfunctional compounds, and the like, as well as mixtures of any two or more thereof. Those of skill in the art recognize that the quantity of bleed control agent employed in the practice of the present invention can vary widely, typically falling in the range of about 0.1 up to about 10 wt %, relative to the weight of the base formulation.

Fillers traditionally employed for the preparation of resin materials having electrically insulating properties are non-conductive materials such as, for example, aluminum nitride, boron nitride, alumina, silicon dioxide, teflon, polyolefins, and the like. Those of skill in the art readily recognize that the desirability of including filler in the invention composition will depend on the end use contemplated therefor. Thus, for example, when preparing compositions for use as a liquid encapsulant, it is desirable to include substantial quantities of filler therein (typically in the range of about 10 up to 75 wt % filler, relative to the weight of the base formulation).

While the use of inert diluents is not excluded from the practice of the present invention, it is generally preferred that compositions according to the invention remain substantially free of solvent, so as to avoid the potentially detrimental effects thereof, e.g., creation of voids caused by solvent escape, the environmental impact of vaporized solvent, the redeposition of outgassed molecules in the surface of the article, and the like. When used, suitable inert diluents include dimethylformamide, dimethylacetamide, N-methylpyrrolidone, toluene, xylene, methylene chloride, tetrahydrofuran, glycol ethers, methyl ethyl ketone or monoalkyl or dialkyl ethers of ethylene glycol, polyethylene glycol, propylene glycol, polypropylene glycol, and the like. When used, inert diluents are typically present in the range of about 0.1 up to about 10 wt %, relative to the weight of the base formulation.

Reactive diluents contemplated for use in the practice of the present invention include any reactive diluent which, in combination with the phenolic- and/or carboxylic acid-containing formulations described herein, forms a thermosetting resin composition. Such reactive diluents include acrylates and methacrylates of monofunctional and polyfunctional alcohols, ethylenically unsaturated compounds, styrenic monomers (i.e., ethers derived from the reaction of vinyl benzyl chlorides with mono-, di-, or trifunctional hydroxy compounds), and the like. When used, reactive diluents are typically present in the range of about 1 up to 15 wt %, relative to the weight of the base formulation.

In a particular aspect, compositions according to the invention optionally further contain in the range of about 0.1 up to about 10 wt % of at least one coupling agent, based on the total weight of the composition. Coupling agents contemplated for use in the practice of the present invention include siloxanes, silicate esters, metal acrylate salts, titanates or compounds containing a co-polymerizable group and a chelating ligand.

Adhesion promoters contemplated for use in the practice of the present invention include polymers that have pendant acid or latent acid groups that can increase adhesion. An example is the Ricon R-130 20% maleated (Ricon Resins, Inc., Grand Junction, Colo.), a polybutadiene with anhydride groups that can react with a surface to increase adhesion. When present, adhesion promoters are typically present in the range of about 0.1 up to 10 wt %, relative to the weight of the base formulation.

Flexibilizers contemplated for use in the practice of the present invention include branched polyalkanes or polysiloxanes that lower the $T_g$ of the formulation. An example of such a material would be polybutadienes such as the Ricon R-130 as described hereinabove. When present, flexibilizers are typically present in the range of about 0.1 up to about 20 wt %, relative to the weight of the base formulation.

Dyes contemplated for use in the practice of the present invention include nigrosine, Orasol blue GN, phthalocyanines, and the like. When used, organic dyes in relatively low amounts (i.e., amounts less than about 0.2 wt %) provide contrast.

Pigments contemplated for use in the practice of the present invention include any particulate material added solely for the purpose of imparting color to the formulation, e.g., carbon black, metal oxides (e.g., $Fe_2O_3$, titanium oxide), and the like. When present, pigments are typically present in the range of about 0.05 up to about 5 wt %, relative to the weight of the base formulation.

In accordance with another embodiment of the present invention, there are provided curable compositions consisting essentially of:
  a curable resin,
  a curing agent,
  optionally, one or more additional components selected from the group consisting of a filler, an anti-oxidant, a bleed control agent, an inert diluent, a reactive diluent, a coupling agent, an adhesion promoter, a flexibilizer, a dye, and a pigment,
  and at least one organic acid,
wherein the cure onset temperature of the curable composition is less than 170° C.

In accordance with still another embodiment of the present invention, there are provided methods for encapsulating electronic components. The method includes the steps of:
applying an curable compositions containing at least one organic acid to the component, and
curing the composition.
Such methods are particularly advantageous when the component being encapsulated is flux contaminated. As readily recognized by those of skill in the art, resin compositions can become flux contaminated in a variety of ways, such as, for example, as a direct result of the soldering process used to metallurgically join one component to another (e.g., metallurgically joining a semiconductor die to a substrate), as a result of contamination from adjacent components, as a result of contamination from secondary processes, and the like.

As readily recognized by those of skill in the art, a variety of techniques can be employed for applying invention compositions to an electronic component, such as, for example, screen printing, extrusion, dispensing, and the like.

Conditions suitable to cure invention curable compositions comprise subjecting invention curable compositions to a temperature in the range of about 120° C. up to about 300° C. for a period of about 0.5 minutes up to about 120 minutes. These conditions can be readily produced in a variety of ways, such, for example, by placing invention curable compositions in a curing oven, by passing invention curable compositions over an in-line heated rail, by exposing invention curable compositions to a belt furnace, or the like.

In accordance with another embodiment of the present invention, there are provided articles prepared according to the above-described method.

In accordance with a further embodiment of the present invention, there are provided methods for encapsulating electronic components. These methods include broadly the steps of curing a composition containing at least one organic acid after application of the composition to the component. Such methods are particularly advantageous when the component being encapsulated is flux contaminated.

Also provided in accordance with the present invention are articles prepared according to the above-described method.

In accordance with a still further embodiment of the present invention, there are provided methods for adhesively attaching an electronic component to a board. These methods include the steps of:
applying a curable composition containing at least one organic acid between the component and the board, and curing the composition.
Such methods are particularly advantageous when the component and/or the board being encapsulated is flux contaminated.

In accordance with another embodiment of the present invention, there are provided methods for adhesively attaching an electronic component to a board, the method comprising curing a composition containing at least one organic acid after application of the composition between the component and the board. Such methods are particularly advantageous when the component and/or the board being adhesively attached is flux contaminated.

In accordance with yet another embodiment of the present invention, there are provided articles comprising an electronic component encapsulated with a cured aliquot of a curable composition containing at least one organic acid. Such articles have particularly desirable properties when the component and/or the board being encapsulated is flux contaminated.

In accordance with still another embodiment of the present invention, there are provided articles comprising an electronic component adhesively attached to a board, wherein the electronic component is adhesively attached to the board by a cured aliquot of a composition containing at least one organic acid. Such articles have particularly desirable properties when the component and/or the board being adhesively attached is flux contaminated.

Those of skill in the art recognize that formulations employed for the preparation of many different electronic packages would benefit from employing organic acids (e.g., phenolic compounds and/or carboxylic acid compounds) as contemplated herein. Examples of electronic packages contemplated for preparation employing invention compositions include ball grid arrays, super ball grid arrays, IC memory cards, chip carriers, hybrid circuits, chip-on-board, multi-chip modules, pin grid arrays, chip scale packages (CSPs), flip chip, discretes, and the like. Additional assemblies contemplated for preparation employing invention compositions include bonding packages to board, bonding daughter boards to board assemblies, bonding boards to housings, bonding heatsinks to assemblies, and the like, especially when such compositions are subjected to flux contamination.

The invention will now be described in greater detail by reference to the following non-limiting examples.

EXAMPLE 1

Acid Modified Underfill Formulation

A melt-mix was prepared by warming 0.75% glutaric acid with 1,6-glycidyloxypropyl-naphthalene epoxy resin at 120° C. This formed a stable solution which was then transferred to a planetary mixer where filler, curing agent and other ingredients were added and mixed until substantial homogeneity was achieved. The contents of the resulting formulation are summarized in Table 1. The resulting mixture was packaged into syringes and kept frozen at −40° C. until ready for use.

TABLE 1

| Component | Content, wt % |
|---|---|
| Glutaric acid | 0.75 |
| 1,6-glycidyloxypropyl-naphthalene epoxy resin | 12.8 |
| Acrylic rubber dispersed Bisphenol F resin | 12.8 |
| Alumina filler | 50.0 |
| Methylhexahydrophthalic anhydride | 21.0 |
| Curezol 2-PHZ-S imidazole catalyst | 0.5 |

The resulting underfill formulation was tested side-by-side with a non-modified control underfill system to evaluate the effectiveness of the carboxylic acid addition on underfilled flip-chip test assemblies. Delamination of the underfill from the die surface of a flip-chip was systematically better after PCT exposure (121° C./100% relative humidity at 2 atm) for the modified system on flux contaminated assemblies (compare the various panels of FIG. 1).

Figure 1A:
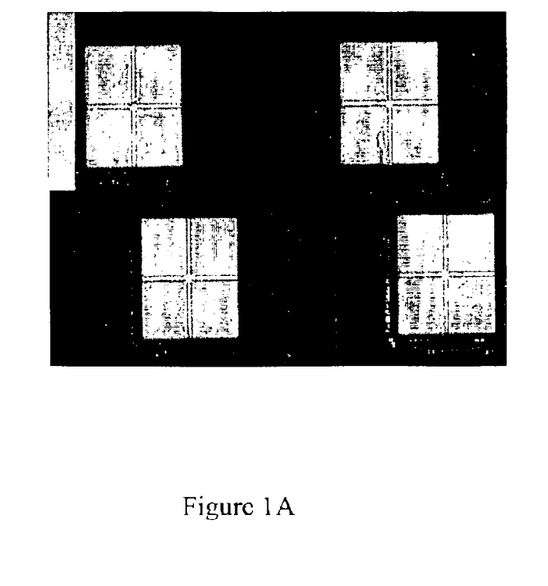
FIG. 1A presents the CSAM analysis of a commercially available underfill formulation prior to exposure to PCT.
Figure 1B:
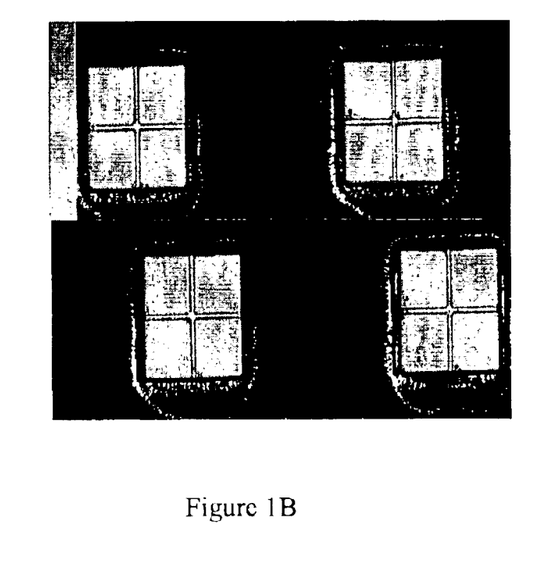
FIG. 1B presents the CSAM analysis of an underfill formulation according to the invention prior to exposure to PCT.
Figure 1C:
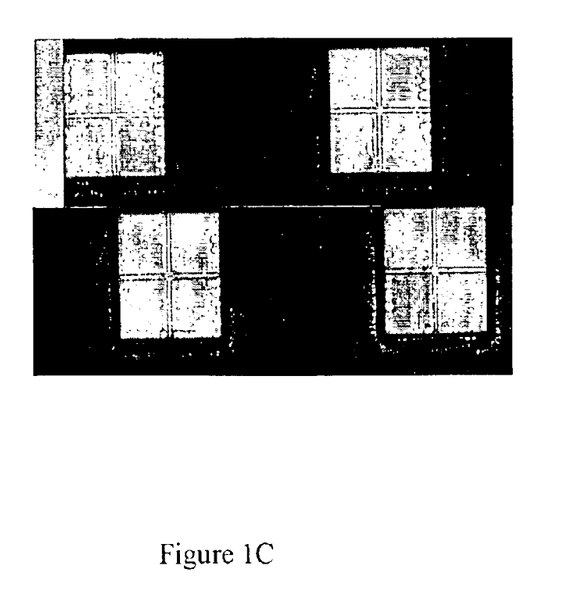
FIG. 1C presents the CSAM analysis of a commercially available underfill formulation after 24 hours exposure to PCT.
Figure 1D:
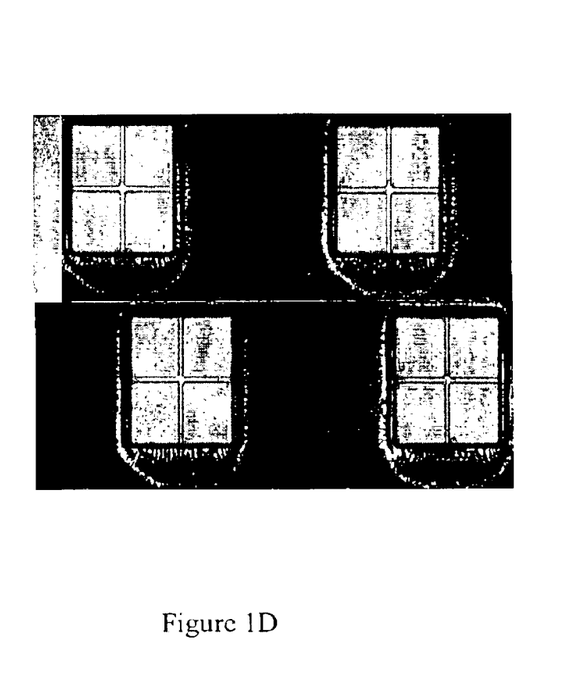
FIG. 1D presents the CSAM analysis of an underfill formulation according to the invention after 24 hours exposure to PCT.
Figure 2:
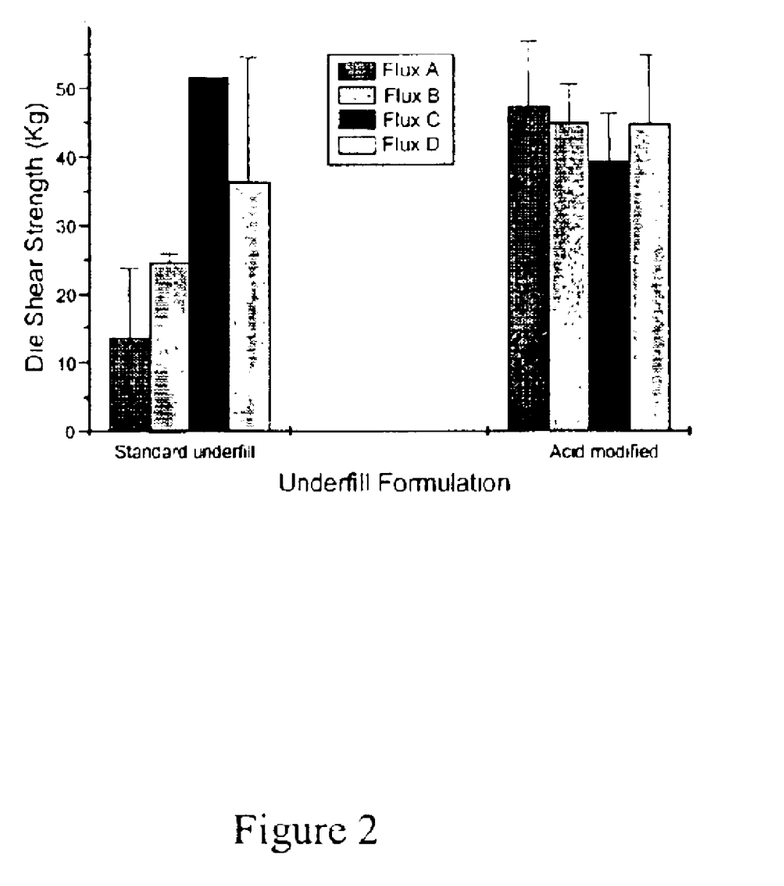
FIG. 2 presents a comparison of die shear adhesion results for commercially available underfill on 4 different flux contaminated die/substrate assemblies, relative to the adhesion to the same substrates when the underfill formulation is modified according to the present invention (by addition of 0.75 wt % glutaric acid to the underfill formulation).

The die shear adhesion of the invention formulation prepared as described in this example was compared to the die shear adhesion of control formulation when applied to several flux contaminated glass slide substrates. The results are presented in FIG. 2. It can be seen that invention formulation performs substantially better than control on most of the substrates tested.

EXAMPLE 2

Phenolic Modified Underfill Formulation

A melt-mix was prepared by warming 1.5% phenolic resin (HRJ1166 from Schenectady Chemicals) with 1,6-glycidyloxypropyl-naphthalene epoxy resin at 120° C. This formed a stable solution which was then transferred to a planetary mixer where filler, curing agent and other ingredients were added and mixed until substantial homogeneity was achieved. The contents of the resulting formulation are summarized in Table 2. The resulting mixture was packaged into syringes and kept frozen at −40° C. until ready for use.

TABLE 2

| Component | Content, wt % |
|---|---|
| Phenolic resin | 1.5 |
| 1,6-glycidyloxypropyl-naphthalene epoxy resin | 12.8 |
| Acrylic rubber dispersed Bisphenol F resin | 12.8 |
| Alumina filler | 50.0 |
| Methylhexahydrophthalic anhydride | 21.0 |
| Curezol 2-PHZ-S imidazole catalyst | 0.5 |

Figure 3:
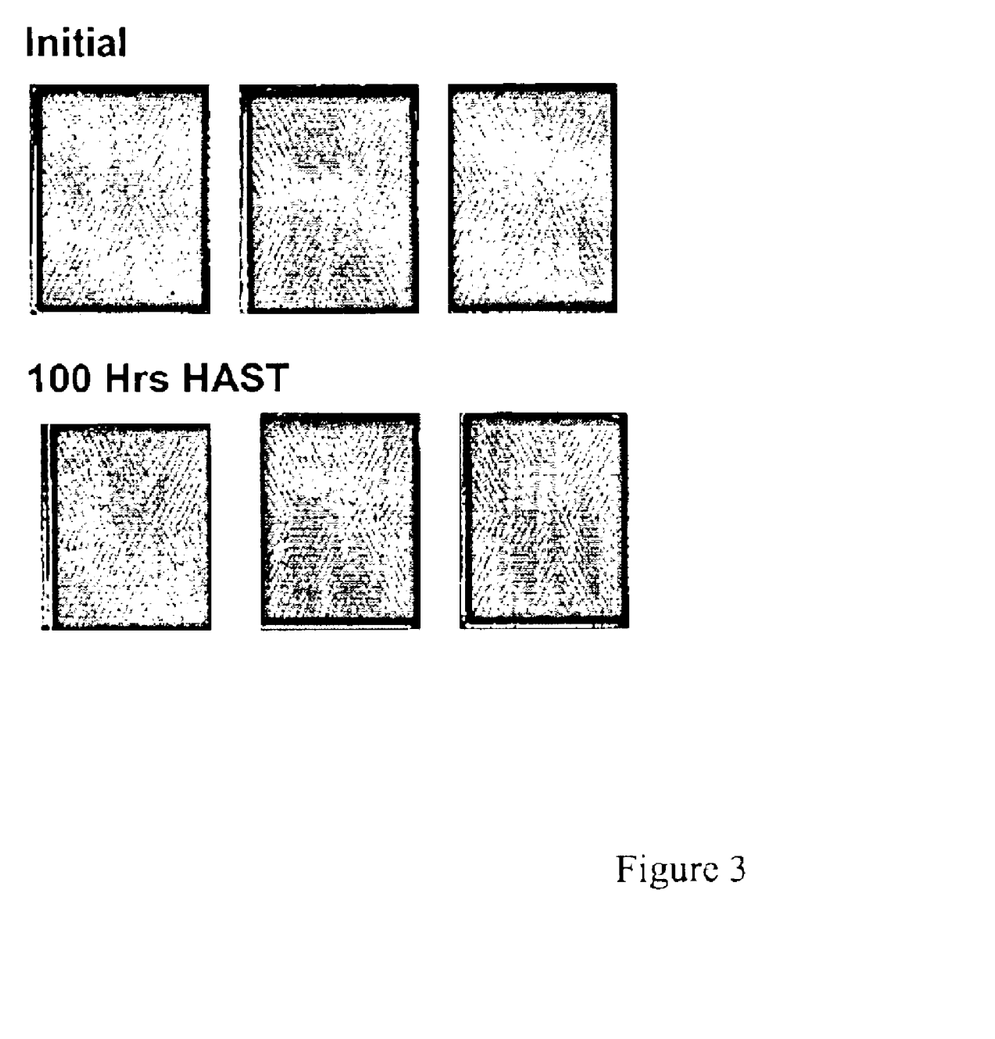
FIG. 3 presents the results of HAST testing (subjecting test samples to 130° C./85% relative humidity for extended exposure periods) of a commercially available product (comparison) and a formulation according to the invention (see Example 2).

The resulting underfill formulation was subjected to HAST exposure (130° C./85% relative humidity). The results of exposure of several test dies to such conditions for 100 hours are presented in FIG. 3, compared to the original dies which have not been subjected to HAST exposure. Spot delamination of the underfill from the die surface of a flip-chip was relatively minimal after HAST exposure, attesting to the benefits of invention modification of underfill formulations.

EXAMPLE 3

Phenolic and Acid-Modified Underfill Formulation

A melt-mix was prepared by warming a combination of 1% phenolic resin (HRJ1166 from Schenectady Chemicals) and 0.75% glutaric acid with 1,6-glycidyloxypropyl-naphthalene epoxy resin at 120° C. This formed a stable solution which was then transferred to a planetary mixer where filler, curing agent and other ingredients were added and mixed until substantial homogeneity was achieved. The contents of the resulting formulation are summarized in Table 3. The resulting mixture was packaged into syringes and kept frozen at −40° C. until ready for use.

TABLE 3

| Component | Content, wt % |
|---|---|
| Phenolic resin | 1.0 |
| Glutaric acid | 0.75 |
| 1,6-glycidyloxypropyl-naphthalene epoxy resin | 12.8 |
| Acrylic rubber dispersed Bisphenol F resin | 12.8 |
| Alumina filler | 50.0 |
| Methylhexahydrophthalic anhydride | 21.0 |
| Curezol 2-PHZ-S imidazole catalyst | 0.5 |

Figure 4:
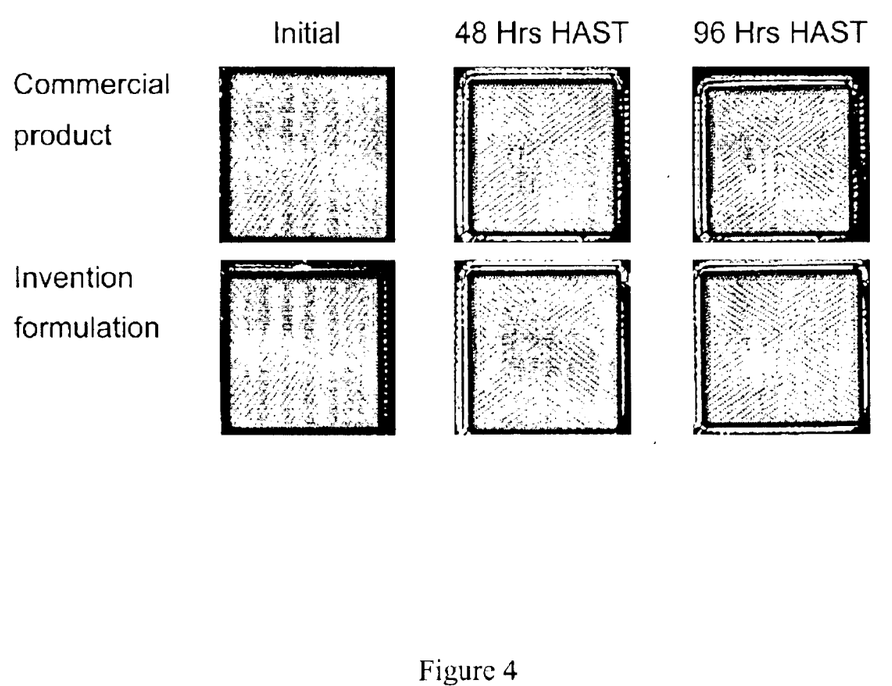
FIG. 4 presents the results of HAST testing of a commercially available product (comparison) and another formulation according to the invention (see Example 3).

The resulting underfill formulation was tested side-by-side with a non-modified control underfill system to evaluate the effectiveness of the phenolic/carboxylic acid addition(s) on underfilled flip-chip test assemblies. Delamination of the underfill from the die surface of a flip-chip was systematically better after HAST exposure (130° C./85% relative humidity) for the modified system on flux contaminated assemblies (see FIG. 4).

A number of the physical properties of the above-described invention formulation were determined and are summarized in Table 4, including a comparison with the properties of the control formulation absent the invention phenolic and glutaric acid additives.

TABLE 4

| Property | Formulation | |
|---|---|---|
| | Control | Invention |
| Viscosity @ 25° C., CP 52/sp20 | 2,300 | 10,700 |
| Flow rate (500 mil flow, 3 mil gap) | | |
| @ 90° C. | 15 sec | — |
| @ 110° C. | — | 18 sec |
| Glass transition temperature (Tg), ° C.; TMA | 140 | 133 |
| Coefficient of Linear Thermal Expansion, | | |
| Alpha 1, ppm/° C. | 45 | 43 |
| Alpha 2, ppm/° C. | 143 | 129 |
| Flexural modulus (Gpa) | 5.6 | 6.0 |
| Adhesion-measured as die shear strength | | |
| (100 mil × 100 mil die at 25° C.): | | |
| Nitride passivated/FR4 substrate | 50 kg | 50 kg |
| Flux contaminated- | 34 kg | 45 kg |
| Nitride passivated/FR4 substrate | | |
| Gel time @ 121° C., minutes | 13.5 | 12 |
| HAST reliability, hours | 48 | 96 |

As can be seen upon inspection of the data presented in Table 4, the performance properties of the above-described invention formulation compare quite favorably with the properties of the control formulation. See, especially, the substantial increase in HAST reliability and die shear strength adhesion to the flux contaminated assembly.

While the invention has been described in detail with reference to certain preferred embodiments thereof, it will be understood that modifications and variations are within the spirit and scope of that which is described and claimed.

That which is claimed is:

1. A method for improving one or more performance properties of a non-fluxing adhesive composition in the presence of flux, flux residues and/or reaction products thereof, wherein the performance properties are selected from the group consisting of flux compatibility, flow properties, voiding characteristics and combinations thereof, and wherein the cure onset temperature of the non-fluxing adhesive composition is less than 170° C., the method comprising adding an amount of at least one organic acid to the non-fluxing adhesive composition effective to improve the one or more performance properties of the non-fluxing adhesive composition in the presence of flux, flux residues and/or reaction products thereof, wherein the organic acid is a phenolic comprising the structure:

wherein:
X is H, alkyl or a di- or poly-valent linker,
Phen is an optionally substituted phenol, and
m is 1–10.

2. A method according to claim 1 wherein the non-fluxing adhesive composition is a capillary flow underfill.

3. A method according to claim 1 wherein the non-fluxing adhesive composition comprises a curable resin selected from the group consisting of epoxy resins, maleimide resins, (meth)acrylate resins, polyamide resins, polyimide resins, cyanate ester resins, and mixtures of any two or more thereof.

4. A method according to claim 1 wherein the di- or poly-valent linker is selected from the group consisting of an optionally substituted alkylene, an optionally substituted oxyalkylene, an optionally substituted carboxyalkylene, an optionally substituted arylene, an optionally substituted oxyarylene, an optionally substituted polyalkyl sulfide, and an optionally substituted polyalkyl amide.

5. A method according to claim 1 wherein m is 1–3.

6. A method according to claim 1 wherein the phenolic is present in an amount within the range of about 0.1 up to about 15 wt %, based on the weight of the total composition.

7. A method according to claim 3 wherein the epoxy resin is selected from the group consisting of 1,6-glycidoxypropyl naphthalene, bis-(4-glycidoxyphenol)isopropane and bis-(4-glycidoxyphenol)methane.

8. A method according to claim 3 wherein the epoxy resin is selected from the group consisting of $C_4$–$C_{28}$ alkyl mono- and di-glycidyl ethers; $C_2$–$C_{28}$ alkyl- and alkenyl-glycidyl esters; $C_1$–$C_{28}$ alkyl-, mono- and poly-phenol glycidyl ethers, epoxidized novolac resins, 3,4-epoxycyclohexylmethyl-3,4-epoxycyclohexane carboxylate, and aniline diglycidyl ether.

9. A method for improving one or more performance properties of a non-fluxing adhesive composition in the presence of flux, flux residues and/or reaction products thereof, wherein the performance properties are selected from the group consisting of flux compatibility, flow properties, voiding characteristics and combinations thereof, and wherein the cure onset temperature of the non-fluxing adhesive composition is less than 170° C., the method comprising adding an amount of at least one organic acid to the non-fluxing adhesive composition effective to improve the one or more performance properties of the non-fluxing adhesive composition in the presence of flux, flux residues and/or reaction products thereof, wherein the epoxy resin comprises 1,6-glycidoxypropyl naphthalene.

10. A method for improving one or more performance properties of a non-fluxing adhesive composition in the presence of flux, flux residues and/or reaction products thereof, wherein the performance properties are selected from the group consisting of flux compatibility, flow properties, voiding characteristics and combinations thereof, and wherein the cure onset temperature of the non-fluxing adhesive composition is less than 170° C., the method comprising adding an amount of at least one organic acid to the non-fluxing adhesive composition effective to improve the one or more performance properties of the non-fluxing adhesive composition in the presence of flux, flux residues and/or reaction products thereof, wherein the curing agent is an anhydride selected from the group consisting of methylhexahydrophthalic anhydride, hexahydrophthalic anhydride, tetrahydrophthalic anhydride, nadic methyl anhydride, benzophenone-tetracarboxylic dianhydride, and anhydride-terminated polybutadiene.

11. A composition of matter comprising:
the combination of:
(a) flux, flux residues or combinations thereof and
(b) a non-fluxing curable composition comprising:
a curable resin,
a curing agent,
a conductive filler, and
at least one organic acid;
wherein the curable composition contains substantially no latent curing agent; and
wherein the cure onset temperature of the curable composition is less than 170° C.

12. A composition of matter comprising:
the combination of:
(a) flux, flux residues or combinations thereof and
(b) a non-fluxing curable composition comprising:
a curable resin,
a curing agent,
a perfluorinated hydrocarbon polymer filler, and
at least one organic acid;
wherein the curable composition contains substantially no latent curing agent; and
wherein the cure onset temperature of the curable composition is less than 170° C.

13. A composition of matter comprising:
the combination of:
(a) flux, flux residues or combinations thereof and
(b) a non-fluxing curable composition comprising:
a curable resin,
a curing agent,
a coupling agent, wherein the coupling agent is selected from the group consisting of a siloxane, a silicate ester, a metal acrylate, and a titanate,
optionally, a filler, and
at least one organic acid;
wherein the curable composition contains substantially no latent curing agent; and
wherein the cure onset temperature of the curable composition is less than 170° C.

14. A composition of matter comprising:
the combination of:
(a) flux, flux residues or combinations thereof and
(b) a non-fluxing curable composition comprising:
a curable resin,
a curing agent,
a coupling agent, wherein the coupling agent is present in an amount within the range of about 0.2 wt % up to about 5 wt %, wherein wt % is based on total weight of the composition,
optionally, a filler, and
at least one organic acid;
wherein the curable composition contains substantially no latent curing agent; and
wherein the cure onset temperature of the curable composition is less than 170° C.

15. A method for encapsulating a flux contaminated electronic component, the method comprising:
applying to the component a non-fluxing adhesive composition comprising:
a curable resin,
a curing agent,
optionally, a filler, and
at least one organic acid;
wherein the non-fluxing adhesive composition contains substantially no latent curing agent; and
wherein the cure onset temperature of the non-fluxing adhesive composition is less than 170° C., and curing the composition.

16. An article prepared according to the method of claim 15.

17. A method for encapsulating a flux contaminated electronic component, the method comprising curing a non-fluxing adhesive composition after application thereof to the component, said non-fluxing adhesive composition comprising:
a curable resin,
a curing agent,
optionally, a filler, and
at least one organic acid;
wherein the non-fluxing adhesive composition contains substantially no latent curing agent; and
wherein the cure onset temperature of the non-fluxing adhesive composition is less than 170° C.

18. An article prepared according to the method of claim 17.

19. A method for adhesively attaching an electronic component to a circuit board, wherein the component and/or the board is flux contaminated, the method comprising:
applying between the component and the board a non-fluxing adhesive composition comprising:
a curable resin,
a curing agent,
optionally, a filler, and
at least one organic acid;
wherein the non-fluxing adhesive composition contains substantially no latent curing agent; and
wherein the cure onset temperature of the non-fluxing adhesive composition is less than 170° C., and curing the composition.

20. A method for adhesively attaching an electronic component to a circuit board, wherein the component and/or the board is flux contaminated, the method comprising curing a non-fluxing adhesive composition after application thereof between the component and the board, said non-fluxing adhesive composition comprising:
a curable resin,
a curing agent,
optionally, a filler, and
at least one organic acid;
wherein the non-fluxing adhesive composition contains substantially no latent curing agent; and
wherein the cure onset temperature of the non-fluxing adhesive composition is less than 170° C.

21. An article comprising a flux contaminated electronic component encapsulated with a cured aliquot of a non-fluxing adhesive composition comprising:
a curable resin,
a curing agent,
optionally, a filler, and
at least one organic acid;
wherein the non-fluxing adhesive composition contains substantially no latent curing agent; and
wherein the cure onset temperature of the non-fluxing adhesive composition is less than 170° C.

22. An article comprising an electronic component adhesively attached to a circuit board, wherein the component and/or the board is flux contaminated, and wherein the electronic component is adhesively attached to the board by a cured aliquot of a non-fluxing adhesive composition comprising:
a curable resin,
a curing agent,
optionally, a filler, and
at least one organic acid;
wherein the non-fluxing adhesive composition contains substantially no latent curing agent; and
wherein the cure onset temperature of the non-fluxing adhesive composition is less than 170° C.

* * * * *